United States Patent
Jeong et al.

(10) Patent No.: US 9,508,454 B2
(45) Date of Patent: Nov. 29, 2016

(54) SEMICONDUCTOR MEMORY DEVICE AND OPERATION METHOD THEREOF

(71) Applicant: SK hynix Inc., Gyeonggi-do (KR)

(72) Inventors: Yo-Han Jeong, Gyeonggi-do (KR);
Ho-Youb Cho, Gyeonggi-do (KR);
Seong-Je Park, Gyeonggi-do (KR);
Chang-Won Yang, Gyeonggi-do (KR);
Seong-Sik Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/820,225

(22) Filed: Aug. 6, 2015

(65) Prior Publication Data
US 2016/0260502 A1    Sep. 8, 2016

(30) Foreign Application Priority Data
Mar. 6, 2015    (KR) .................. 10-2015-0031640

(51) Int. Cl.
*G11C 29/00*    (2006.01)
*G11C 29/44*    (2006.01)
*G11C 29/38*    (2006.01)
*G11C 29/04*    (2006.01)

(52) U.S. Cl.
CPC ........... *G11C 29/4401* (2013.01); *G11C 29/04* (2013.01); *G11C 29/38* (2013.01)

(58) Field of Classification Search
CPC ... G11C 29/4401; G11C 29/38; G11C 29/04; G11C 29/0401; G06F 11/2094; G11B 20/1183

USPC ........ 714/710, 711, 718, 723, 763; 365/200, 365/201; 711/202, 205
See application file for complete search history.

(56) References Cited

U.S. PATENT DOCUMENTS

| | | | |
|---|---|---|---|
| 2004/0240283 A1* | 12/2004 | Tellier .................... | G11C 29/00 365/200 |
| 2006/0077733 A1* | 4/2006 | Cheng .................. | G11C 29/846 365/200 |
| 2010/0284222 A1* | 11/2010 | Jang ....................... | G11C 17/16 365/185.09 |

FOREIGN PATENT DOCUMENTS

KR    1020110078738    7/2011

\* cited by examiner

*Primary Examiner* — Christine Tu
(74) *Attorney, Agent, or Firm* — IP & T Group LLP

(57) ABSTRACT

Disclosed are a semiconductor memory device and an operation method thereof. The semiconductor memory device includes a main buffer suitable for storing input data during a first operation period of a write operation, a repair operation unit suitable for selectively latching the input data based on whether the input data is used for repair during the first operation period of the write operation; a repair buffer suitable for storing the latched input data during a second operation period subsequent to the first operation period, and a column operation unit suitable for controlling an operation to write the input data stored in the main buffer or the repair buffer in a main memory cell or a repair memory cell during the second operation period of the write operation.

16 Claims, 4 Drawing Sheets

SEMICONDUCTOR MEMORY DEVICE AND OPERATION METHOD THEREOF

CROSS-REFERENCE TO RELATED APPLICATIONS

The present application claims priority of Korean Patent Application No. 10-2015-0031640, filed on Mar. 6, 2015, which is incorporated herein by reference in its entirety.

BACKGROUND

1. Field

Exemplary embodiments of the present invention relate to a semiconductor design technology, and more particularly, to a data input/output circuit of a semiconductor memory device, and an operation method thereof.

2. Description of the Related Art

In general, when a semiconductor memory device has even one defective cell amongst many thousands of cells, it is treated as a failed product. However, discarding the entire memory device as a failed product due to failure of only a few cells is not efficient in terms of yield.

At the present time, a defective cell is replaced with a replacement cell that is designated in advance so that the memory device can be salvaged, resulting in an improvement in yield. In the prior art, during a data input operation in which input data and an external address are inputted, it is determined whether the external address is a main address or a repair address through an address comparison circuit, and the input data is transmitted to and stored in a main buffer or a repair buffer based on a determination result.

In the aforementioned data input method, it is necessary to further ensure an operation time margin for simultaneously inputting data to the main buffer and the repair buffer and storing the data therein due to the time required for the address comparison operation.

SUMMARY

Various embodiments are directed to a semiconductor memory device capable of ensuring a stable data input/output margin even though inputted/outputted data is used for repair, and an operation method thereof.

In an embodiment, a semiconductor memory device may include: a main buffer suitable for storing input data during a first operation period of a write operation; a repair operation unit suitable for selectively latching the input data based on whether the input data is used for repair during the first operation period of the write operation; a repair buffer suitable for storing the latched input data during a second operation period subsequent to the first operation period; and a column operation unit suitable for controlling an operation to write the input data stored in the main buffer or the repair buffer in a main memory cell or a repair memory cell during the second operation period of the write operation.

In another embodiment, an operation method of a semiconductor memory device may include: storing input data in a main buffer during a first operation period of a write operation; selectively latching the input data based on whether the input data is used for repair for the first operation period of the write operation; storing the latched input data in a repair buffer when the input data is used for repair, and writing the input data stored in the repair buffer in a repair memory cell, during a second operation period subsequent to the first operation period; and writing the input data stored in the main buffer in a main memory cell when the input data is not used for repair, during the second operation period.

The present technology proposes a scheme in which input/output data for repair to be stored in a repair buffer is latched in a data latch in an intermediate process.

Consequently, even when input/output data is used for repair, it is possible to stably ensure a data input/output margin.

DETAILED DESCRIPTION

Figure 1:
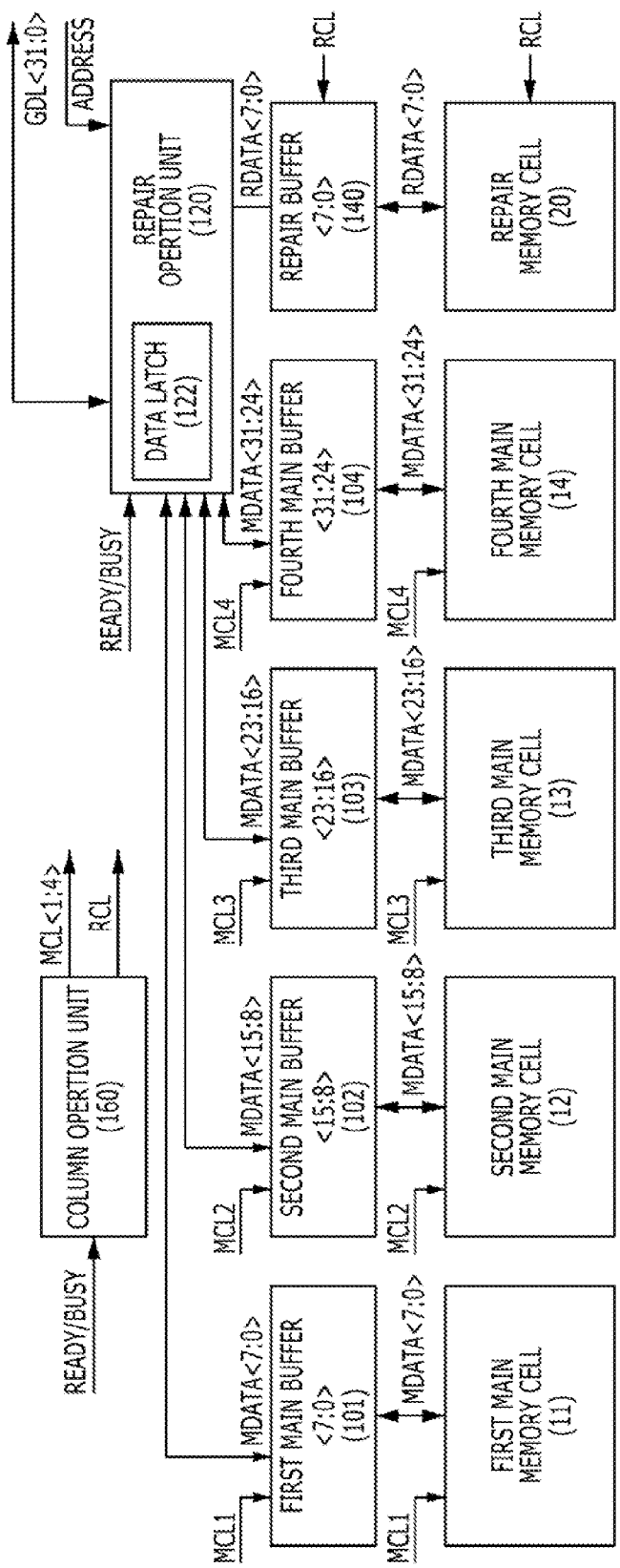
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned.

FIG. 1 is a block diagram illustrating a semiconductor memory device in accordance with an embodiment of the present invention.

Referring to FIG. 1, the semiconductor memory device includes main memory cells 11 to 14, a repair memory cell 20, main buffers 101 to 104, a repair operation unit 120, a repair buffer 140, and a column operation unit 160.

A basic operation of each element included in the semiconductor memory device in accordance with the embodiment of the present invention will be described below.

The main memory cells 11 to 14 may include a first main memory cell 11, a second main memory cell 12, a third main memory cell 13, and a fourth main memory cell 14 on the basis of the data bit number in a column direction. In detail, 32-bit data GDL<31:0> is inputted/outputted in the column direction and divided into four pieces of data MDATA<7:0>, MDATA<15:8>, MDATA<23:16>, and MDATA<31:24> as illustrated in the drawing. The main memory cells 11 to 14 may include the first to the fourth main memory cells 11 to 14, each of which stores the respective pieces of data MDATA<7:0>, MDATA<15:8>, MDATA<23:16>, and MDATA<31:24>. Of course, this configuration where there is four main memory cells 11 to 14, is for illustrative purposes only, and other configurations may be employed according to design options.

The repair memory cell 20 is a memory cell for storing repair data RDATA<7:0> having substantially the same value as that of the data MDATA<7:0>, MDATA<15:8>, MDATA<23:16>, or MDATA<31:24> to be stored in a defective main memory cell 11, 12, 13, or 14 when the data MDATA<7:0>, MDATA<15:8>, MDATA<23:16>, or MDATA<31:24> is not normally stored due to failure in any one of the first to fourth main memory cells 11 to 14. That is, the repair memory cell 20 stores the repair data RDATA<7:0> corresponding to the defective main memory cell 11, 12, 13, or 14 from the total 32-bit data MDATA<7:0>, MDATA<15:8>, MDATA<23:16>, and MDATA<31:24> divided into four by 8 bits. Accordingly, the characteristics of the repair memory cell 20 and the main memory cells 11 to 14 are substantially the same. For example, when the main memory cells 11 to 14 are NAND flash memory cells, the repair memory cell 20 is also a NAND flash memory cell.

The main buffers 101 to 104 may include a first main buffer 101, a second main buffer 102, a third main buffer 103, and a fourth main buffer 104, which respectively buffer and store the data MDATA<7:0>, MDATA<15:8>, MDATA<23:16>, and MDATA<31:24> inputted/outputted to/from the main memory cells 11 to 14.

The repair buffer 140 buffers and stores the repair data RDATA<7:0> inputted/outputted to/from the repair memory cell 20.

The main buffers 101 to 104 and the repair buffer 140 are used because the operation for writing the data MDATA<7:0>, MDATA<15:8>, MDATA<23:16>, MDATA<31:24>, and RDATA<7:0> in the main memory cells 11 to 14 and the repair memory cell 20, or reading the data MDATA<7:0>, MDATA<15:8>, MDATA<23:16>, MDATA<31:24>, and RDATA<7:0> from the main memory cells 11 to 14 and the repair memory cell 20 takes a long time. For example, when the main memory cells 11 to 14 and the repair memory cell 20 are NAND flash memory cells, the main buffers 101 to 104 and the repair buffer 140 may act as page buffers. Furthermore, since the main memory cells 11 to 14 include the first to fourth main memory cells 11 to 14, the main buffers 101 to 104 corresponding to the main memory cells 11 to 14 also include the first to fourth main buffers 101 to 104.

The repair operation unit 120 determines one of the first to fourth main buffers 101 to 104 and one of the first to fourth main memory cells 11 to 14 to be replaced with the repair buffer 140 and the repair memory cell 20 based on an address ADDRESS inputted from outside. The repair operation unit 120 may include a data latch 122 which latches the repair data RDATA<7:0> inputted/outputted to/from the repair buffer 140 and the repair memory cell 20, during an intermediate process.

The column operation unit 160 controls an operation for writing the data MDATA<7:0>, MDATA<15:8>, MDATA<23:16>, MDATA<31:24>, and RDATA<7:0> respectively stored in the main buffers 101 to 104 and the repair buffer 140, in the main memory cells 11 to 14 and the repair memory cell 20 in a write operation. Furthermore, in a read operation, the column operation unit 160 controls an operation for reading the data MDATA<7:0>, MDATA<15:8>, MDATA<23:16>, MDATA<31:24>, and RDATA<7:0> respectively stored in the main memory cells 11 to 14 and the repair memory cell 20 to the main buffers 101 to 104 and the repair buffer 140. To this end, the column operation unit 160 generates signals MCL<1:4> and RCL for controlling the operations of the main buffers 101 to 104, the repair buffer 140, the main memory cells 11 to 14, and the repair memory cell 20. In this case, since any one of the first to fourth main memory cells 11 to 14 is replaced with the repair memory cell 20, only data stored in only three of the first to fourth main buffers 101 to 104 and the repair buffer 140 is to be stored in the main memory cells 11 to 14 and the repair memory cell 20. For example, when it is assumed that the second memory cell 12 of the first to fourth main memory cells 11 to 14 is a defective cell, the data MDATA<7:0>, MDATA<23:16>, and MDATA<31:24> stored in the main buffers 101, 103, and 104, except for the second main buffer 102 of the first to fourth main buffers 101 to 104, and the repair data RDATA<7:0> stored in the repair buffer 140 are stored in the three main memory cells 11, 13, and 14 and the repair memory cell 20. Of course, the repair data RDATA<7:0> has substantially the same value as that of the data MDATA<15:8> to be stored in the defective second main memory cell 12.

Hereinafter, the operations of the present invention will be described based on the basic configuration of the semiconductor memory device in accordance with the aforementioned embodiment of the present invention.

The write operation of the semiconductor memory device in accordance with the embodiment of the present invention will be described below.

In the write operation, the main buffers 101 to 104 store input data MDATA<7:0>, MDATA<15:8>, MDATA<23:16>, and MDATA<31:24> applied from outside (e.g. from an external source or host) for a first operation period.

Furthermore, for the first operation period of the write operation, the repair operation unit 120 selectively latches the input data MDATA<7:0>, MDATA<15:8>, MDATA<23:16>, and MDATA<31:24> according to whether any of the input data MDATA<7:0>, MDATA<15:8>, MDATA<23:16>, and MDATA<31:24> is to be replaced with the repair data RDATA<7:0>.

For example, for the first operation period of the write operation, when the first data MDATA<7:0> of the input data MDATA<7:0>, MDATA<15:8>, MDATA<23:16>, and MDATA<31:24> is data for repair, the repair operation unit 120 latches the input data MDATA<7:0> in the data latch 122 as the repair data RDATA<7:0>.

Similarly, for the first operation period of the write operation, when the fourth data MDATA<31:24> of the input data MDATA<7:0>, MDATA<15:8>, MDATA<23:16>, and MDATA<31:24> is data for repair, the repair operation unit 120 latches the input data MDATA<31:24> in the data latch 122 as the repair data RDATA<7:0>.

Furthermore, in the write operation, the repair buffer 140 stores the repair data RDATA<7:0> stored in the data latch 122 for a second operation period subsequent to the first operation period.

During the first operation period of the write operation, data selected as the repair data RDATA<7:0> from the input data MDATA<7:0>, MDATA<15:8>, MDATA<23:16>, and MDATA<31:24> may be latched in the data latch 122 and simultaneously may be stored in the main buffers 101 to 104. In this way, even though the repair data RDATA<7:0> is stored twice, it does not have any influence on the write operation. That is, even though the data selected as the repair data RDATA<7:0> has been stored in the main buffers 101 to 104, since the main memory cells 11 to 14 corresponding to the main buffers 101 to 104 are defective cells, the data is not actually written. Of course, the input data MDATA<7:0>, MDATA<15:8>, MDATA<23:16>, or MDATA<31:24> corresponding to the repair data RDATA<7:0> may be controlled not to be stored in the main buffers 101 to 104, or controlled to be stored in the main buffers 101 to 104 and then deleted before the write operation is actually performed depending on the design.

During the second operation period of the write operation, the column operation unit 160 controls to write the input data MDATA<7:0>, MDATA<15:8>, MDATA<23:16>, MDATA<31:24>, and RDATA<7:0> respectively stored in the main buffers 101 to 104 and the repair buffer 140, in the main memory cells 11 to 14 and the repair memory cell 20.

As described above, the write operation of the semiconductor memory device in accordance with an embodiment of the present invention is performed during the first operation period and the second operation period, and an operation discrimination signal READY/BUSY for discriminating the first operation period and the second operation period is inputted to the column operation unit 160 and the repair operation unit 120.

In detail, the first operation period of a general write operation, in which the operation discrimination signal READY/BUSY is 'BUSY', corresponds to a time required for storing the input data MDATA<7:0>, MDATA<15:8>, MDATA<23:16>, and MDATA<31:24> inputted from the outside in the main buffers 101 to 104. That is, the first operation period indicates from when the write operation starts in response to a write command, to when the optimal time required for storing the input data MDATA<7:0>, MDATA<15:8>, MDATA<23:16>, and MDATA<31:24> inputted through a data input pad (not illustrated) to the main buffers 101 to 104 through an address decoding process (not illustrated) of selecting a memory cell for storing the data, has passed.

The second operation period of the general write operation, in which the operation discrimination signal READY/BUSY is 'READY, corresponds to a time required for writing the input data MDATA<7:0>, MDATA<15:8>, MDATA<23:16>, and MDATA<31:24> stored in the main buffers 101 to 104 in the main memory cells 11 to 14. That is, the second operation period indicates from the escape of the first operation period of the write operation to when the optimal time required for writing the Input data MDATA<7:0>, MDATA<15:8>, MDATA<23:16>, and MDATA<31:24> in the main memory cells 11 to 14, has passed.

For example, when the main memory cells 11 to 14 are NAND flash memory cells, it is necessary to perform a preparation operation such as the generation of a program voltage having a high level in order to perform the write operation, and then to perform an operation for writing the input data MDATA<7:0>, MDATA<15:8>, MDATA<23:16>, and MDATA<31:24> by using the generated program voltage and the like. As described above, a time which is obtained by adding the preparation time of the write operation to the actual execution time of the write operation, corresponds to the second operation period of the write operation.

The operation discrimination signal READY/BUSY is generated by an element (not illustrated) for setting the operation of the semiconductor memory device such as a memory register set (MRS) of the semiconductor memory device, and when the state of the operation discrimination signal READY/BUSY is changed from 'BUSY' to 'READY', may be set in advance by design. Furthermore, generally the second operation period is longer than the first operation period of the write operation. That is, the time for storing the input data MDATA<7:0>, MDATA<15:8>, MDATA<23:16>, and MDATA<31:24> in the main buffers 101 to 104 is generally shorter than the time for writing the input data MDATA<7:0>, MDATA<15:8>, MDATA<23: 16>, and MDATA<31:24> stored in the main buffers 101 to 104 in the main memory cells 11 to 14.

The first operation period and second operation period of the aforementioned general write operation have no problems when no failure occurs in the main memory cells 11 to 14. However, when failure occurs in any one of the main memory cells 11 to 14 and the defective cell should be replaced with the repair memory cell 20, it is difficult to store any of the input data MDATA<7:0>, MDATA<15:8>, MDATA<23:16>, and MDATA<31:24> as the repair data RDATA<7:0> in the repair buffer 140 for the first operation period of the general write operation, which may be set by design. This is because the time for storing the repair data RDATA<7:0> in the repair buffer 140 is longer than the time for storing the input data MDATA<7:0>, MDATA<15:8>, MDATA<23:16>, and MDATA<31:24> in the main buffers 101 to 104.

For example, since the repair data RDATA<7:0> is stored in the repair buffer 140 after the operation for selecting the repair data RDATA<7:0> from the input data MDATA<7:0>, MDATA<15:8>, MDATA<23:16>, and MDATA<31:24> is performed, it requires more time than that of the operation for storing the input data MDATA<7:0>, MDATA<15:8>, MDATA<23:16>, and MDATA<31:24> in the main buffers 101 to 104.

Accordingly, in the semiconductor memory device in accordance with the embodiment of the present invention, during the first operation period of the write operation, the input data MDATA<7:0>, MDATA<15:8>, MDATA<23: 16>, and MDATA<31:24> are respectively stored in the main buffers 101 to 104 and simultaneously the repair data RDATA<7:0> to be written in the repair memory cell 20 is latched in the data latch 122 of the repair operation unit 120.

In this case, the time required for latching the repair data RDATA<7:0> in the data latch 122 is shorter than the time required for storing the repair data RDATA<7:0> in the repair buffer 140. Therefore, it is possible to sufficiently latch the repair data RDATA<7:0> during the time for which the input data MDATA<7:0>, MDATA<15:8>, MDATA<23:16>, and MDATA<31:24> are stored in the main buffers 101 to 104.

Furthermore, in the semiconductor memory device in accordance with the embodiment of the present invention, during the second operation period of the write operation, an operation for writing the input data MDATA<7:0>, MDATA<15:8>, MDATA<23:16>, and MDATA<31:24> stored in the main buffers 101 to 104 in the main memory cells 11 to 14 is performed. In addition, during the second operation period of the write operation, an operation for storing the repair data RDATA<7:0> stored in the data latch 122 of the repair operation unit 120 in the repair buffer 140 is performed, and then an operation for storing the repair data RDATA<7:0> stored in the repair buffer 140 in the repair memory cell 20 is performed.

In this case, during the second operation period of the write operation, it is possible that the repair data RDATA<7: 0> may be stored in the repair buffer 140 from the data latch 122 and then may be written in the repair memory cell 20 from the repair buffer 140, since the second operation period of the write operation may be discriminated (i.e. separated) into a write preparation time and a write operation time.

In detail, since the write preparation time of the second operation period of the write operation is a time for generating a program voltage and the like for the write operation, it is not a time for actually writing the input data MDATA<7: 0>, MDATA<15:8>, MDATA<23:16>, and MDATA<31: 24> stored in the main buffers 101 to 104 in the main memory cells 11 to 14. Accordingly, during the write preparation time of the second operation period of the write operation, it is possible to perform an operation for copying the repair data RDATA<7:0> latched in the data latch 122 into the repair buffer 140.

In this way, the repair data RDATA<7:0> is stored in the repair buffer 140 during the write preparation time of the second operation period of the write operation, and it is possible to perform both an operation for storing the input data MDATA<7:0>, MDATA<15:8>, MDATA<23:16>, and MDATA<31:24> stored in the main buffers 101 to 104 in the main memory cells 11 to 14 and an operation for storing the repair data RDATA<7:0> stored in the repair buffer 140 in the repair operation unit 120 during the write operation time subsequent to the write preparation time.

Hereinafter, a read operation of the semiconductor memory device in accordance with the embodiment of the present invention will be described.

The write operation is discriminated into the first operation period and the second operation period, but the read operation includes only the second operation period. This is because in the read operation, an operation for reading output data MDATA<7:0>, MDATA<15:8>, MDATA<23:16>, MDATA<31:24>, and RDATA<7:0> from the main memory cells 11 to 14 and the repair memory cell 20 is performed immediately in response to a read command, but in the write operation, input data MDATA<7:0>, MDATA<15:8>, MDATA<23:16>, MDATA<31:24>, and RDATA<7:0> are inputted from outside before a direct write operation is performed on the main memory cells 11 to 14 and the repair memory cell 20 in response to a write command.

That is, in the write operation, a separate operation for receiving the data and storing the data in a buffer should be further performed before the direct write operation is performed on the main memory cells 11 to 14 and the repair memory cell 20 in response to the write command, but in the read operation, a direct read operation is performed on the main memory cells 11 to 14 and the repair memory cell 20 immediately in response to the read command.

Accordingly, the second operation period of the read operation may correspond to an entire read operation required for reading the output data MDATA<7:0>, MDATA<15:8>, MDATA<23:16>, MDATA<31:24>, and RDATA<7:0> respectively stored in the main memory cells 11 to 14 and the repair memory cell 20, to the main buffers 101 to 104 and the repair buffer 140, and outputting the data externally.

In detail, during the second operation period of the read operation, the output data MDATA<7:0>, MDATA<15:8>, MDATA<23:16>, and MDATA<31:24> read from the main memory cells 11 to 14 is stored in the main buffers 101 to 104. Since no data has been actually written in a defective one of the main memory cells 11 to 14, even though the read operation is performed, no data is outputted. Accordingly, no data is stored in the main buffer 101, 102, 103, or 104 corresponding to the defective main memory cell 11, 12, 13, or 14.

Furthermore, during the second operation period of the read operation, the repair data RDATA<7:0> read from the repair memory cell 20 is stored in the repair buffer 140.

In this case, an operation for directly storing the data MDATA<7:0>, MDATA<15:8>, MDATA<23:16>, MDATA<31:24>, and RDATA<7:0> in the main buffers 101 to 104 and the repair buffer 140 is controlled by the column operation unit 160. That is, during the second operation period of the read operation, the column operation unit 160 controls to read the output data MDATA<7:0>, MDATA<15:8>, MDATA<23:16>, MDATA<31:24>, and RDATA<7:0> respectively stored in the main memory cells 11 to 14 and the repair memory cell 20, and store the read data in the main buffers 101 to 104 and the repair buffer 140.

Furthermore, during the second operation period of the read operation, the repair operation unit 120 latches the repair data RDATA<7:0> stored in the repair buffer 140 by using the data latch 122, and decides whether to output the latched repair data RDATA<7:0> to the outside according to whether the latched repair data RDATA<7:0> is used for repair. That is, instead of outputting the data MDATA<7:0>, MDATA<15:8>, MDATA<23:16>, or MDATA<31:24> from the main buffer 101, 102, 103, or 104 corresponding to the defective main memory cell 11, 12, 13, or 14 of the main memory cells 11 to 14, the repair operation unit 120 operates to output the repair data RDATA<7:0> latched in the data latch 122. For example, when the third main memory cell 13 of the main memory cells 11 to 14 is a defective cell, the repair operation unit 120 operates to output the repair data RDATA<7:0> latched in the data latch 122 when the third main buffer 103 outputs data.

Figure 2:
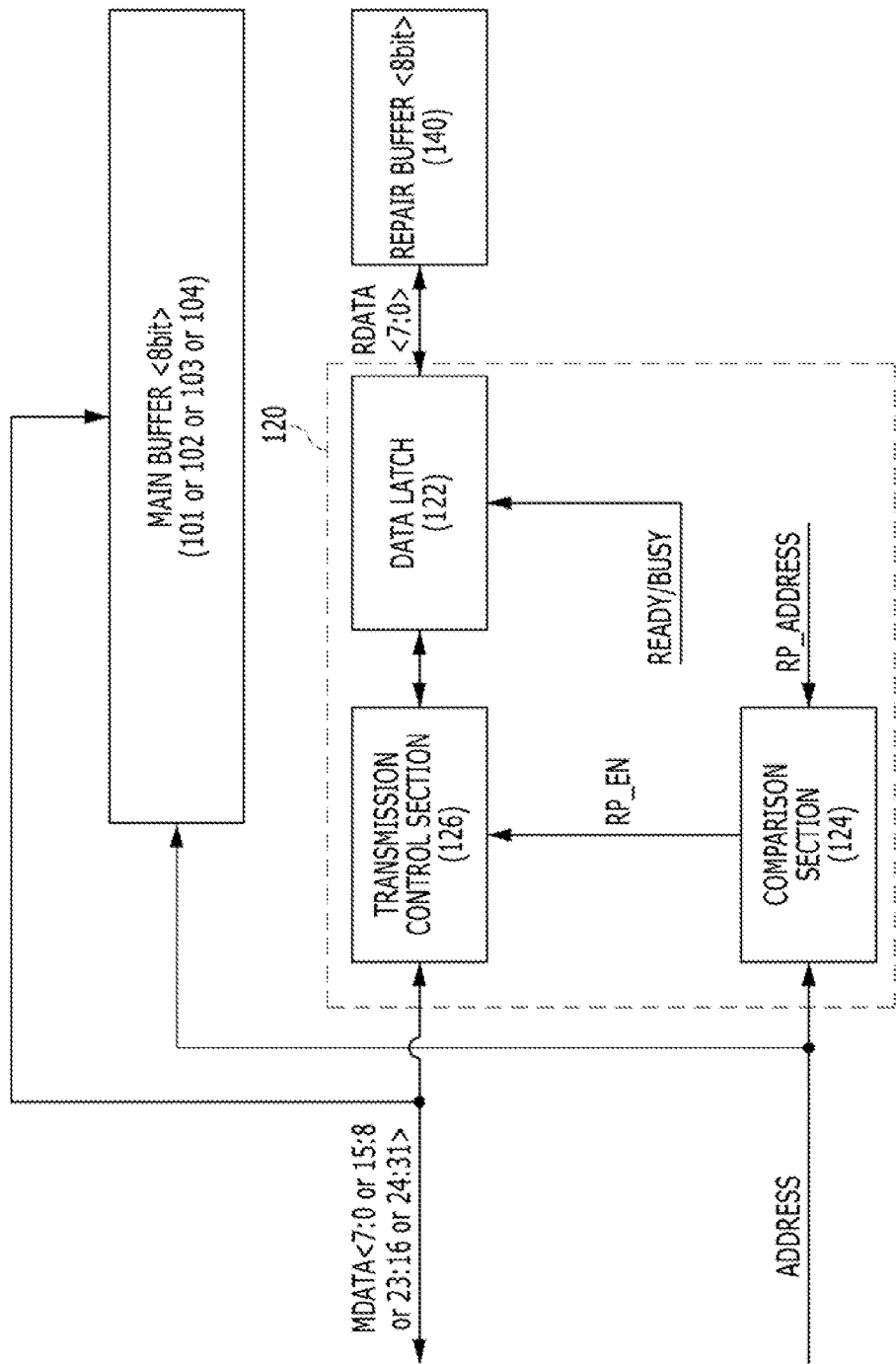
FIG. 2 is a detailed block diagram illustrating a repair operation unit of the semiconductor memory device illustrated in FIG. 1 in accordance with an embodiment of the present invention.

FIG. 2 is a detailed block diagram illustrating the repair operation unit of the semiconductor memory device illustrated in FIG. 1 in accordance with an embodiment of the present invention.

Referring to FIG. 2, the repair operation unit 120 of the semiconductor memory device illustrated in FIG. 1 in accordance with an embodiment of the present invention includes the data latch 122, a comparison section 124, and a transmission control section 126.

FIG. 2 illustrates only the main buffer 101, 102, 103, or 104 for storing the data MDATA<7:0>, MDATA<15:8>, MDATA<23:16>, or MDATA<31:24> of 8 bits. This is because the main buffer 101, 102, 103, or 104 illustrated in FIG. 2 is assumed as a main buffer for repair selected from the first to fourth main buffers 101 to 104 illustrated in FIG. 1. Accordingly, although not directly illustrated in the drawing, the main memory cell 11, 12, 13, or 14 corresponding to the main buffer 101, 102, 103, or 104 illustrated in FIG. 2 is a defective memory cell.

In detail, the comparison section 124 compares an input address ADDRESS corresponding to input data MDATA<7:0>, MDATA<15:8>, MDATA<23:16>, and MDATA<31:24> in the write operation or output data MDATA<7:0>, MDATA<15:8>, MDATA<23:16>, and MDATA<31:24> in the read operation with a repair address RP_ADDRESS stored in advance, and generates a repair transfer signal RP_EN based on a comparison result. For example, the comparison section 124 compares a value of the address ADDRESS corresponding to the first input data MDATA<7:0> with a value of the repair address RP_ADDRESS, and checks whether the first input data MDATA<7:0> corresponds to the repair data RDATA<7:0>. Similarly, the comparison section 124 compares a value of the address ADDRESS corresponding to the second input data MDATA<15:8> with the value of the repair address RP_ADDRESS, and checks whether the second input data MDATA<15:8> corresponds to the repair data RDATA<7:0>.

In this way, the comparison section 124 checks whether each of the input data MDATA<7:0>, MDATA<15:8>, MDATA<23:16>, and MDATA<31:24> corresponds to the repair data RDATA<7:0>, and activates the repair transfer signal RP_EN when the data corresponds to the repair data RDATA<7:0>. For example, when the first input data MDATA<7:0> corresponds to the repair data RDATA<7:0>, the comparison section 124 activates only the repair transfer signal RP_EN corresponding to the first input data MDATA<7:0>, and deactivates repair transfer signals RP_EN corresponding to the input data MDATA<15:8>, MDATA<23:16>, and MDATA<31:24>.

The repair address RP_ADDRESS is stored in advance in a repair address storage circuit (not illustrated), and has a value decided in advance through a test process.

In the write operation, the transmission control section 126 controls whether to transfer the input data MDATA<7:0>, MDATA<15:8>, MDATA<23:16>, and MDATA<31:24> in response to the repair transfer signal RP_EN. That is, in the write operation, the transmission control section 126 controls whether to transmit the input data MDATA<7:0>, MDATA<15:8>, MDATA<23:16>, and MDATA<31:24> to the data latch 122 in response to the repair transfer signal RP_EN. For example, when the first input data MDATA<7:0> is selected as the repair data RDATA<7:0> and only the repair transfer signal RP_EN corresponding to the first input data MDATA<7:0> is activated, only the first input data MDATA<7:0> is transferred to the data latch 122. Of course, since the repair transfer signals RP_EN corresponding to the input data MDATA<15:8>, MDATA<23:16>, and MDATA<31:24>, except for the first input data MDATA<7:0>, have been deactivated, the input data MDATA<15:8>, MDATA<23:16>, and MDATA<31:24> are not transferred to the data latch 122.

Furthermore, in the read operation, the transmission control section 126 controls whether to transfer the output data MDATA<7:0>, MDATA<15:8>, MDATA<23:16>, and MDATA<31:24> in response to the repair transfer signal RP_EN. That is, in the read operation, the transmission control section 126 controls whether to transmit the output data MDATA<7:0>, MDATA<15:8>, MDATA<23:16>, and MDATA<31:24> stored in the data latch 122 to the outside in response to the repair transfer signal RP_EN. For example, when the first input data MDATA<7:0> is selected as the repair data RDATA<7:0> and has been stored in the data latch 122, the repair transfer signal RP_EN is activated in response to when the first input data MDATA<7:0> should be outputted to the outside, and the repair data RDATA<7:0> is outputted to the outside. Of course, since the input data MDATA<15:8>, MDATA<23:16>, and MDATA<31:24>, except for the first input data MDATA<7:0>, are not the repair data RDATA<7:0>, the input data MDATA<15:8>, MDATA<23:16>, and MDATA<31:24> are to be directly outputted to the outside from the main buffers 102 to 104 instead of the repair buffer 140.

The data latch 122 is isolated from the repair buffer 140 during the first operation period existing only in the write operation, and is coupled to the repair buffer 140 during the second operation period existing in both the write operation and the read operation.

In detail, during the first operation period of the write operation, the data latch 122 is coupled to the transmission control section 126 and is isolated from the repair buffer 140, and latches the repair data RDATA<7:0> inputted from the outside as data for repair. During the second operation period of the write operation, the data latch 122 is coupled to the transmission control section 126 and the repair buffer 140, and allows the repair data RDATA<7:0> latched during the first operation period to be stored in the repair buffer 140.

Furthermore, during the second operation period of the read operation, the data latch 122 is coupled to the transmission control section 126 and the repair buffer 140, and latches the repair data RDATA<7:0> read to the repair buffer 140.

Figure 3A:
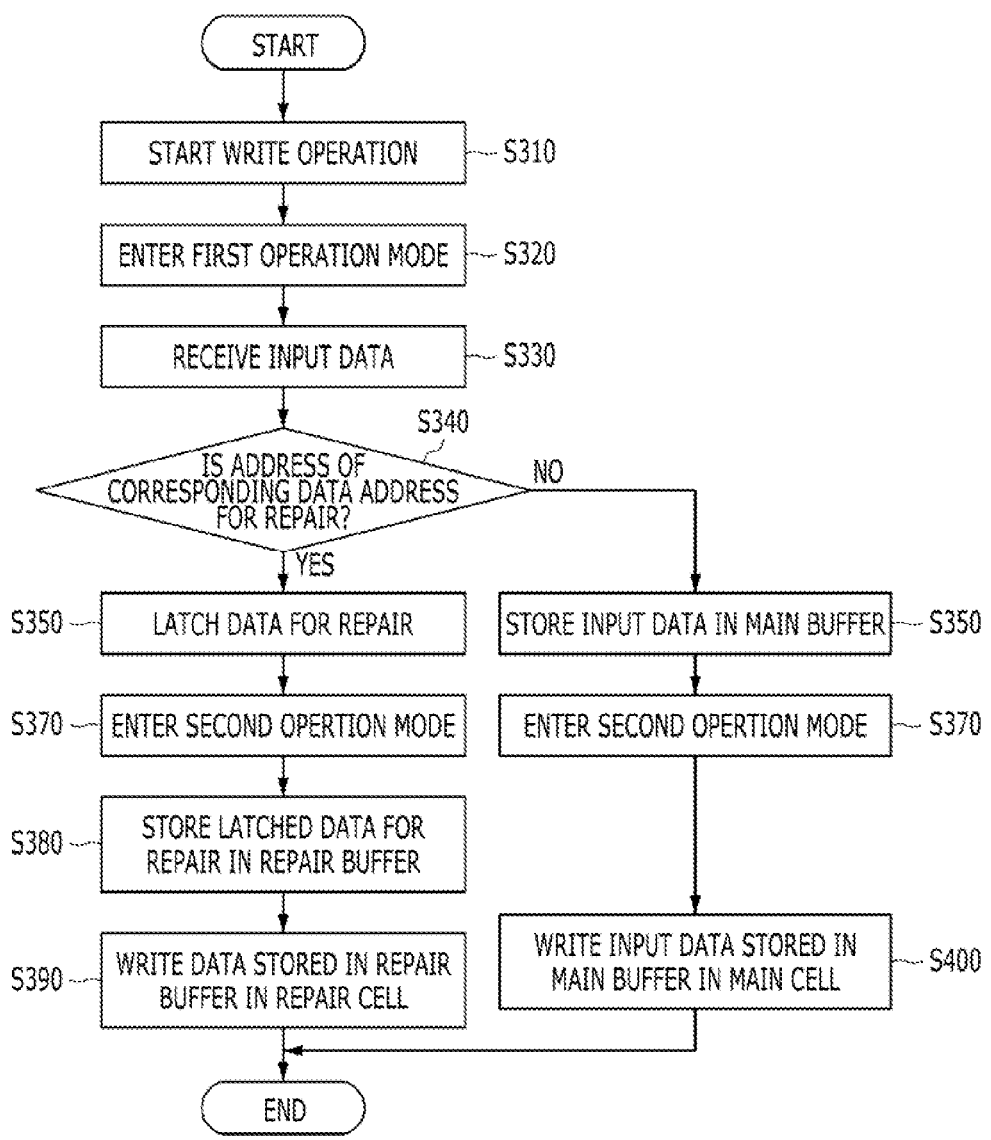
FIGS. 3A and 3B are flowcharts for explaining an operation of the semiconductor memory device illustrated in FIG. 1 and FIG. 2 in accordance with an embodiment of the present invention.
Figure 3B:
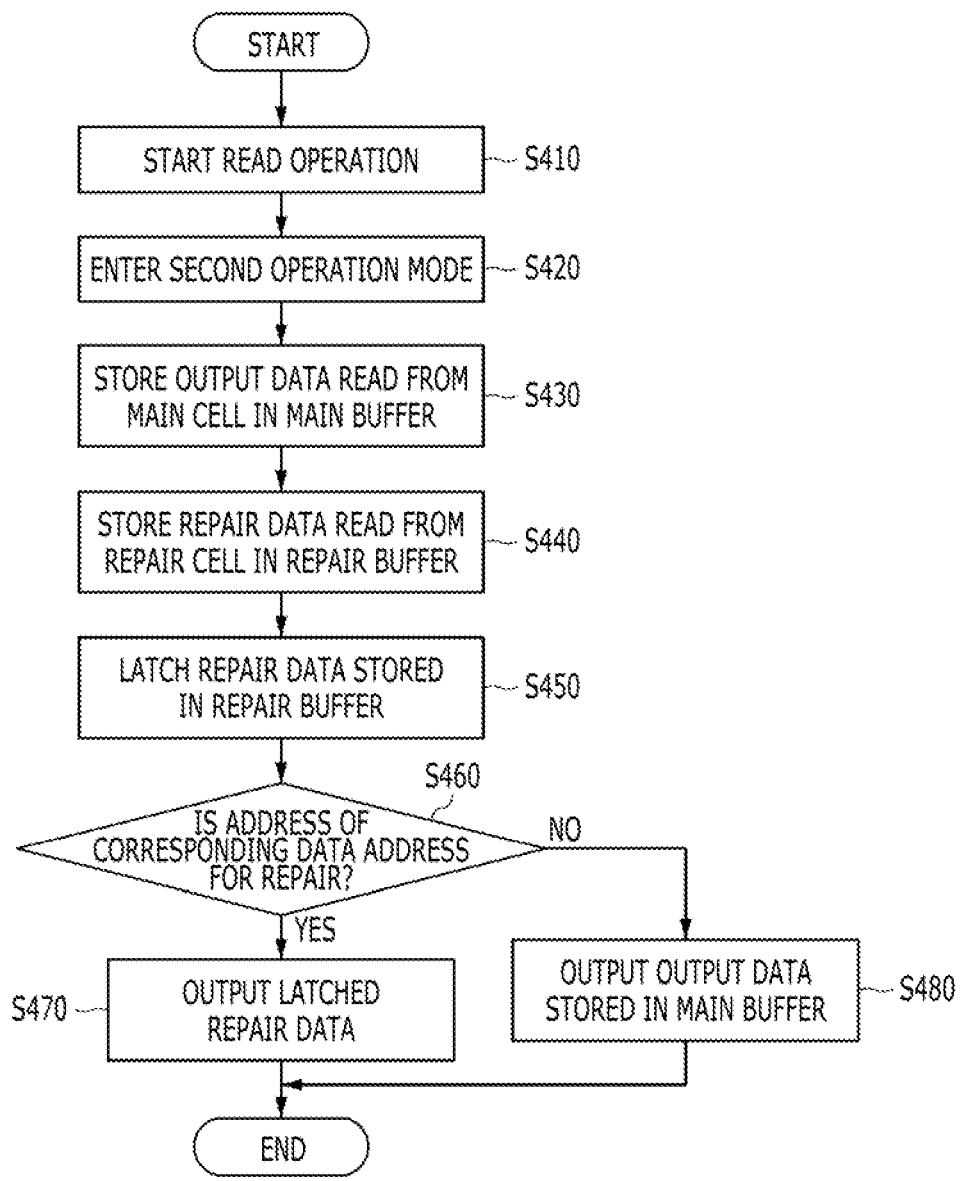

FIGS. 3A and 3B are flowcharts for explaining an operation of the semiconductor memory device illustrated in FIG. 1 and FIG. 2 in accordance with the embodiment of the present invention.

Referring to FIGS. 3A and 3B, it is possible to recognize the sequences of a write operation and a read operation performed by the semiconductor memory device illustrated in FIG. 1 and FIG. 2 in accordance with an embodiment of the present invention.

Referring to FIG. 3A, when a write command is inputted, the write operation starts at step S310 so as to simultaneously enter a first operation mode of the write operation at step S320.

During the first operation mode of the write operation, the semiconductor memory device receives 32-bit input data GDL<31:0> as four pieces of the data MDATA<7:0>, MDATA<15:8>, MDATA<23:16>, and MDATA<31:24> by 8 bits at step S330, and determines whether there is data for repair among them at step S340.

To this end, it is checked whether an address ADDRESS corresponding to each of the four pieces of data MDATA<7:0>, MDATA<15:8>, MDATA<23:16>, and MDATA<31:24> is identical to a repair address RP_ADDRESS at step S340.

In this case, among the four pieces of data MDATA<7:0>, MDATA<15:8>, MDATA<23:16>, and MDATA<31:24>, data determined as the repair data RDATA<7:0> is transferred and latched into the data latch 122 at step S350.

Data, except for the data MDATA<7:0>, MDATA<15:8>, MDATA<23:16>, or MDATA<31:24> selected as the repair data RDATA<7:0> among the four pieces of data MDATA<7:0>, MDATA<15:8>, MDATA<23:16>, and MDATA<31:24>, are transferred and stored into the main buffer 101, 102, 103, or 104 at step S360.

As described above, the data MDATA<7:0>, MDATA<15:8>, MDATA<23:16>, or MDATA<31:24> may also be transferred and stored into the main buffer 101, 102, 103, or 104 as data for repair, but since this may operate differently depending on design, it is not illustrated in FIG. 3.

In this way, after the four pieces of data MDATA<7:0>, MDATA<15:8>, MDATA<23:16>, and MDATA<31:24> are latched in the data latch 122 and is stored in the main buffer 101, 102, 103, or 104, a second operation mode of the write operation is entered at step S370.

When the second operation mode of the write operation is entered and simultaneously the write preparation time starts, the repair data RDATA<7:0> latched in the data latch 122 is stored in the repair buffer 140 at step S380. In such a write preparation time, the input data MDATA<7:0>, MDATA<15:8>, MDATA<23:16>, and MDATA<31:24> are stored in the main buffer 101 to 104 and substantially maintain the stored state, and no operation is performed.

When the write operation time starts after the write preparation time, the repair data RDATA<7:0> stored in the repair buffer 140 is written in the repair memory cell 20 at step S390, and the input data MDATA<7:0>, MDATA<15:8>, MDATA<23:16>, and MDATA<31:24> stored in the main buffer 101 to 104 are written in the main memory cells 11 to 14 at step S400. Even though the input data MDATA<7:0>, MDATA<15:8>, MDATA<23:16>, or MDATA<31:24> corresponding to the repair data RDATA<7:0> has been stored in the main buffer 101, 102, 103, or 104, since the main memory cell 11, 12, 13, or 14 corresponding to the main buffer 101, 102, 103, or 104 is a defective memory cell, no data is written.

Referring to FIG. 38, when a read command is inputted, the read operation starts at step S410 so as to simultaneously enter a second operation mode of the read operation at step S420.

During the second operation mode of the read operation, output data MDATA<7:0>, MDATA<15:8>, MDATA<23:16>, and MDATA<31:24> are read from the main memory cells 11 to 14, and stored in the main buffers 101 to 104 at step S430. Furthermore, the repair data RDATA<7:0> is read from the repair operation unit 120 and stored in the repair buffer 140 at step S440. The data stored in the repair buffer 140 is also latched in the data latch 122 at step S450.

In this case, since the output data MDATA<7:0>, MDATA<15:8>, MDATA<23:16>, or MDATA<31:24> has not been written in the defective main memory cell 11, 12, 13, or 14 of the main memory cells 11 to 14, no data is read. Accordingly, no data is stored in the main buffer 101, 102, 103, or 104 corresponding to the defective main memory cell 11, 12, 13, or 14.

In such a state, the four pieces of output data MDATA<7:0>, MDATA<15:8>, MDATA<23:16>, and MDATA<31:24> stored in the main buffers 101 to 104 are output.

Then, it is checked whether an address ADDRESS corresponding to the output data MDATA<7:0>, MDATA<15:8>, MDATA<23:16>, or MDATA<31:24> is identical to the repair address RP_ADDRESS to check the repair data RDATA<7:0> at step S460.

When the output data MDATA<7:0>, MDATA<15:8>, MDATA<23:16>, or MDATA<31:24> is not data for repair, it is outputted from the main buffer 101, 102, 103, or 104 at step S480.

However, when the output data MDATA<7:0>, MDATA<15:8>, MDATA<23:16>, or MDATA<31:24> is the data for repair, it is outputted from the data latch 122 at step S470.

As described above, when the embodiment of the present invention is applied, input/output data for repair to be stored in the repair buffer is latched in the data latch during an intermediate process.

Consequently, even though inputted/outputted data is used for repair, it is possible to stably ensure a data input/output margin.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a main buffer suitable for storing input data during a first operation period of a write operation;
a repair operation unit suitable for selectively latching the input data based on whether the input data is used for repair during the first operation period of the write operation;
a repair buffer suitable for storing the latched input data during a second operation period subsequent to the first operation period; and
a column operation unit suitable for controlling an operation to write the input data stored in the main buffer or the repair buffer in a main memory cell or a repair memory cell during the second operation period of the write operation.

2. The semiconductor memory device of claim 1, wherein the column operation unit controls an operation for reading output data stored in the main memory cell or the repair memory cell to the main buffer or the repair buffer during the second operation period of a read operation.

3. The semiconductor memory device of claim 2, wherein, during the second operation period of the read operation, the repair operation unit latches the output data stored in the repair buffer and decides whether to output the latched output data based on whether the latched output data is used for repair.

4. The semiconductor memory device of claim 3, wherein the repair operation unit comprises:
a comparison section suitable for comparing an input address or an output address corresponding to the input data or the output data with a repair address stored in advance, and generating a repair transfer signal based on a comparison result;
a transmission control section suitable for controlling whether to transfer the input data or the output data in response to the repair transfer signal; and
a data latch suitable for being isolated from the repair buffer during the first operation period, being coupled to the repair buffer during the second operation period, and latching data transferred between the transmission control section and the repair buffer.

5. The semiconductor memory device of claim 4, wherein the comparison section activates the repair transfer signal when the input address or the output address is identical to the repair address, and deactivates the repair transfer signal when the input address or the output address is different from the repair address.

6. The semiconductor memory device of claim 4, wherein the transmission control section transfers the input data applied from outside to the data latch when the repair transfer signal is activated, and does not transfer the input data to the data latch when the repair transfer signal is deactivated in the write operation, and
transfers the output data latched in the data latch to the outside when the repair transfer signal is activated, and does not transfer the output data latched in the data latch to the outside when the repair transfer signal is deactivated in the read operation.

7. The semiconductor memory device of claim 3, wherein the first operation period corresponds to a time required for storing the input data applied from outside in the main buffer in the write operation.

8. The semiconductor memory device of claim 3, wherein the second operation period corresponds to a time obtained by adding a write preparation time to a write operation time, which are required for writing the input data stored in the main buffer or the input data latched in the data latch in the main memory cell or the repair memory cell in the write operation, and
corresponds to a read operation time required for reading the output data stored in the main memory cell or the repair memory cell to the main buffer or the repair buffer and outputting the output data to outside in the read operation.

9. The semiconductor memory device of claim 8, wherein the repair operation unit stores the input data selectively latched in the data latch in the repair buffer during the write preparation time of the write operation.

10. The semiconductor memory device of claim 8, wherein the column operation unit controls to write the input data stored in the main buffer or the repair buffer in the main memory cell or the repair memory cell during the write operation time of the write operation.

11. An operation method of a semiconductor memory device, comprising:

storing input data in a main buffer during a first operation period of a write operation;

selectively latching the input data based on whether the input data is used for repair for the first operation period of the write operation;

storing the latched input data in a repair buffer when the input data is used for repair, and writing the input data stored in the repair buffer in a repair memory cell, during a second operation period subsequent to the first operation period; and writing the input data stored in the main buffer in a main memory cell when the input data is not used for repair, during the second operation period.

12. The operation method of the semiconductor memory device of claim 11, further comprising:

when output data is read from the main memory cell during the second operation period of a read operation, storing the read output data in the main buffer;

isolating the repair buffer from outside during the second operation period of the read operation; and outputting the output data stored in the main buffer to the outside.

13. The operation method of the semiconductor memory device of claim 12, further comprising:

when output data is read from the repair memory cell during the second operation period of the read operation, storing the read output data in the repair buffer;

coupling the repair buffer to the outside during the second operation period of the read operation; and outputting the output data stored in the repair buffer to the outside.

14. The operation method of the semiconductor memory device of claim 13, wherein the first operation period corresponds to a time required for storing the input data applied from outside in the main buffer in the write operation.

15. The operation method of the semiconductor memory device of claim 13, wherein the second operation period corresponds to a time obtained by adding a write preparation time to a write operation time, which are required for writing the input data stored in the main buffer or the latched input data in the main memory cell or the repair memory cell in the write operation, and corresponds to a read operation time required for reading the output data stored in the main memory cell or the repair memory cell to the main buffer or the repair buffer and outputting the output data to the outside in the read operation.

16. The operation method of the semiconductor memory device of claim 15, wherein the writing of the input data in the repair memory cell comprises:

storing the latched input data latched in the repair buffer during the write preparation time of the write operation; and writing the input data in the repair memory cell in the write operation time of the write operation.

* * * * *